United States Patent
Braganca et al.

(10) Patent No.: US 8,670,216 B1
(45) Date of Patent: Mar. 11, 2014

(54) CURRENT-PERPENDICULAR-TO-THE-PLANE (CPP) MAGNETORESISTIVE SENSOR WITH AN EXCHANGE-COUPLED REFERENCE LAYER HAVING SHAPE ANISOTROPY

(71) Applicant: HGST Netherlands B.V., Amsterdam (NL)

(72) Inventors: Patrick Mesquita Braganca, San Jose, CA (US); Jeffrey R. Childress, San Jose, CA (US); Yang Li, San Jose, CA (US); Neil Smith, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/764,559

(22) Filed: Feb. 11, 2013

(51) Int. Cl.
*G11B 5/39* (2006.01)

(52) U.S. Cl.
USPC .................................. 360/324.11; 360/324.2

(58) Field of Classification Search
USPC .................. 360/324.1, 324.11, 324.12, 324.2
See application file for complete search history.

(56) References Cited

U.S. PATENT DOCUMENTS

| | | | |
|---|---|---|---|
| 3,256,483 A | 6/1966 | Broadbent | |
| 5,703,485 A * | 12/1997 | Guo et al. | 324/235 |
| 5,818,323 A | 10/1998 | Maeda et al. | |
| 6,510,031 B1 | 1/2003 | Gambino et al. | |
| 6,697,233 B2 * | 2/2004 | Liao et al. | 360/315 |
| 7,095,596 B2 | 8/2006 | Schmollngruber et al. | |
| 7,206,174 B2 * | 4/2007 | Sbiaa et al. | 360/324.1 |
| 7,346,977 B2 | 3/2008 | Cyrille et al. | |
| 7,564,659 B2 | 7/2009 | Freitag et al. | |
| 7,672,090 B2 | 3/2010 | Carey et al. | |
| 7,848,065 B2 | 12/2010 | Freitag et al. | |
| 8,015,694 B2 | 9/2011 | Carey et al. | |
| 2003/0231437 A1 | 12/2003 | Childress et al. | |
| 2010/0091416 A1 * | 4/2010 | Katada et al. | 360/324.11 |

OTHER PUBLICATIONS

Chow, et al., Aspect Ratio of Magnetoresistive Detector Stripes, IBM Technical Disclosure Bulletin, vol. 24, No. 3, p. 1481, Aug. 1981.

* cited by examiner

*Primary Examiner* — Jefferson Evans
(74) *Attorney, Agent, or Firm* — Thomas R. Berthold

(57) ABSTRACT

A current-perpendicular-to-the-plane (CPP) magnetoresistive (MR) sensor has a reference layer formed as an exchange-coupled structure. The exchange-coupled structure includes a patterned layer formed of alternating stripes of ferromagnetic stripes and nonmagnetic stripes, and a continuous unpatterned ferromagnetic layer in contact with and exchange-coupled to the ferromagnetic stripes of the patterned layer. The ferromagnetic stripes have a length-to-width aspect ratio of at least 2, which results in increased uniaxial anisotropy of the exchange-coupled ferromagnetic layer.

15 Claims, 8 Drawing Sheets

CURRENT-PERPENDICULAR-TO-THE-PLANE (CPP) MAGNETORESISTIVE SENSOR WITH AN EXCHANGE-COUPLED REFERENCE LAYER HAVING SHAPE ANISOTROPY

BACKGROUND OF THE INVENTION

1. Field of the Invention

The invention relates generally to a current-perpendicular-to-the-plane (CPP) magnetoresistive (MR) sensor that operates with the sense current directed perpendicularly to the planes of the layers making up the sensor stack, and more particularly to a CPP-MR sensor with a more stable reference layer.

2. Background of the Invention

One type of conventional MR sensor used as the read head in magnetic recording disk drives is a "spin-valve" sensor based on the giant magnetoresistance (GMR) effect. A GMR spin-valve sensor has a stack of layers that includes two ferromagnetic layers separated by a nonmagnetic electrically conductive spacer layer, which is typically copper (Cu). One ferromagnetic layer adjacent the spacer layer has its magnetization direction fixed, such as by being pinned by exchange coupling with an adjacent antiferromagnetic layer, and is referred to as the reference layer. The other ferromagnetic layer adjacent the spacer layer has its magnetization direction free to rotate in the presence of an external magnetic field and is referred to as the free layer. With a sense current applied to the sensor, the rotation of the free-layer magnetization relative to the reference-layer magnetization due to the presence of an external magnetic field is detectable as a change in electrical resistance. If the sense current is directed perpendicularly through the planes of the layers in the sensor stack, the sensor is referred to as a current-perpendicular-to-the-plane (CPP) sensor.

In addition to CPP-GMR read heads, another type of CPP-MR sensor is a magnetic tunnel junction sensor, also called a tunneling MR or TMR sensor, in which the nonmagnetic spacer layer is a very thin nonmagnetic tunnel barrier layer. In a CPP-TMR sensor the tunneling current perpendicularly through the layers depends on the relative orientation of the magnetizations in the two ferromagnetic layers. In a CPP-GMR read head the nonmagnetic spacer layer is formed of an electrically conductive material, typically a metal such as Cu. In a CPP-TMR read head the nonmagnetic spacer layer is formed of an electrically insulating material, such as $TiO_2$, MgO, or $Al_2O_3$.

The fixed or pinned ferromagnetic layer in a CPP-MR sensor used in read heads may be a single pinned layer (sometimes called a "simple" pinned layer) or part of an antiparallel (AP) pinned structure. In a simple pinned structure the pinned layer may have its magnetization pinned by being exchange-coupled to an antiferromagnetic pinning layer, which is typically a Mn alloy like IrMn. In an AP-pinned structure first (AP1) and second (AP2) ferromagnetic layers are separated by a nonmagnetic antiparallel coupling (APC) layer with the magnetization directions of the two AP-pinned ferromagnetic layers oriented substantially antiparallel. The AP1 layer, which is in contact with the antiferromagnetic layer on one side and the nonmagnetic APC layer on the other side, is the pinned layer. The AP2 layer, which is in contact with the nonmagnetic APC layer on one side and the sensor's electrically conductive spacer layer on the other side, is the reference layer.

Due to decreasing read head dimensions, the stability of the reference layer has become an issue. One technique that addresses this problem is directional ion milling of a seed layer onto which the reference layer is subsequently deposited. This results in additional uniaxial anisotropy in the reference layer. This technique is described in U.S. Pat. No. 7,564,659 B2 and U.S. Pat. No. 7,762,090 B2, both assigned to the same assignee as this application. However, with this technique it can be difficult to achieve uniformity over an entire wafer, from which a large number of sensors are fabricated.

What is needed is a CPP-MR sensor with a reference layer with induced uniaxial anisotropy that will improve stability.

SUMMARY OF THE INVENTION

This invention relates to a CPP-MR sensor with a reference layer formed as an exchange-coupled structure. The exchange-coupled structure includes a patterned layer formed of alternating stripes of ferromagnetic stripes and nonmagnetic stripes, and a continuous unpatterned ferromagnetic layer in contact with and exchange-coupled to the ferromagnetic stripes of the patterned layer. The ferromagnetic stripes have a length-to-width aspect ratio of at least 2, which results in increased uniaxial anisotropy of the exchange-coupled ferromagnetic layer. The patterned layer may be located below or above the unpatterned ferromagnetic layer, or between two ferromagnetic layers, in which case both ferromagnetic layers would be exchange coupled to the ferromagnetic stripes of the patterned layer.

For a fuller understanding of the nature and advantages of the present invention, reference should be made to the following detailed description taken together with the accompanying figures.

DETAILED DESCRIPTION OF THE INVENTION

Figure 1:
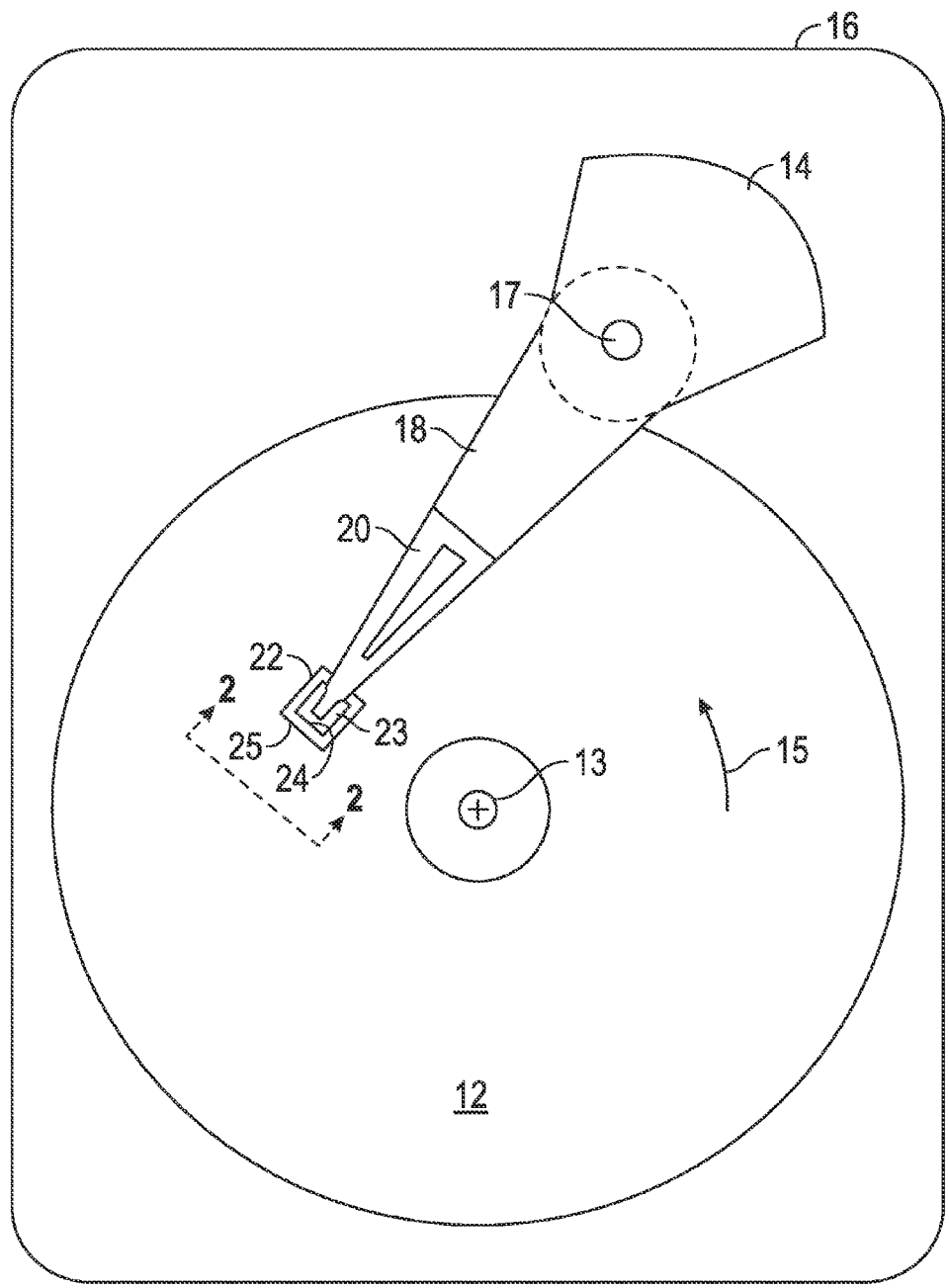
FIG. 1 is a schematic top view of a conventional magnetic recording hard disk drive with the cover removed.

The CPP magnetoresistive (MR) sensor of this invention has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
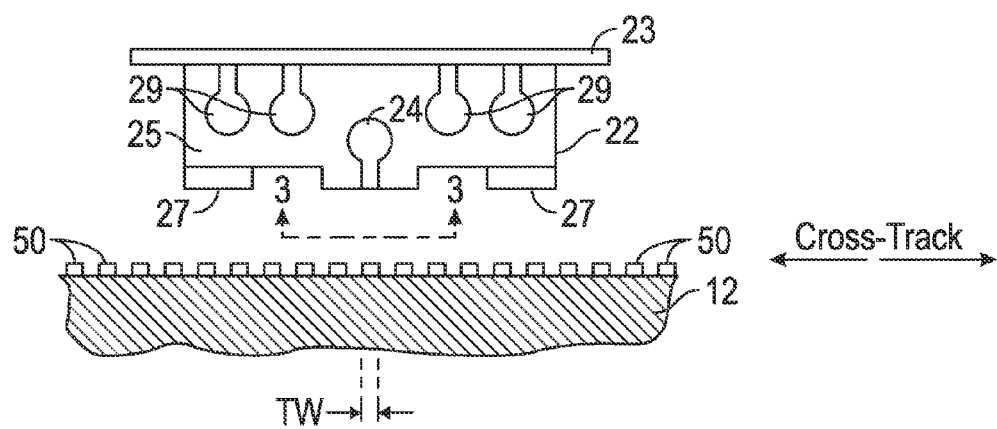
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25. As shown in the sectional view of FIG. 2, the disk 12 is a patterned-media disk with discrete data tracks 50 spaced-apart in the cross-track direction, one of which is shown as being aligned with read/write head 24. The discrete data tracks 50 have a track width TW in the cross-track direction and may be formed of continuous magnetizable material in the circumferential direction, in which case the patterned-media disk 12 is referred to as a discrete-track-media (DTM) disk. Alternatively, the data tracks 50 may contain discrete data islands spaced-apart along the tracks, in which case the patterned-media disk 12 is referred to as a bit-patterned-media (BPM) disk. The disk 12 may also be a conventional continuous-media (CM) disk wherein the recording layer is not patterned, but is a continuous layer of recording material. In a CM disk the concentric data tracks with track width TW are created when the write head writes on the continuous recording layer.

Figure 3:
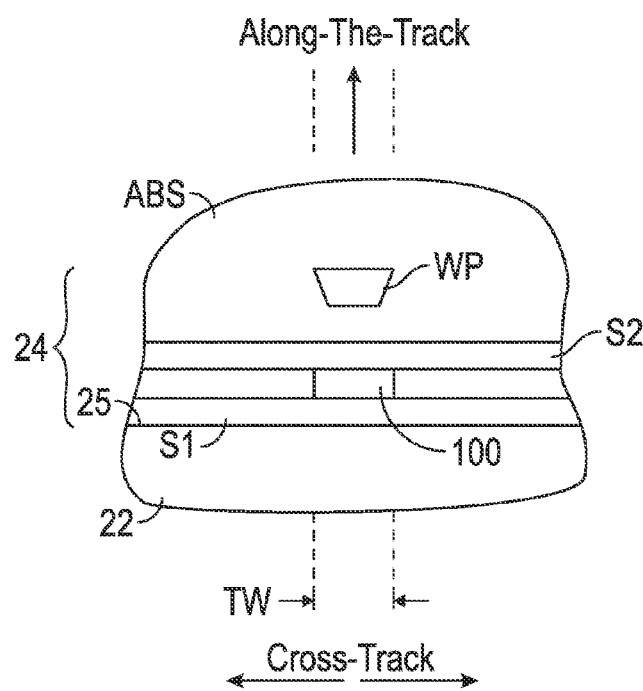
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes a perpendicular magnetic write pole (WP) and may also include trailing and/or side shields (not shown). The CPP MR sensor or read head 100 is located between two magnetic shields S1 and S2. The shields S1, S2 are formed of magnetically permeable material, typically a NiFe alloy, and may also be electrically conductive so they can function as the electrical leads to the read head 100. The shields function to shield the read head 100 from recorded data bits that are neighboring the data bit being read. Separate electrical leads may also be used, in which case the read head 100 is formed in contact with layers of electrically conducting lead material, such as ruthenium, tantalum, gold, or copper, that are in contact with the shields S1, S2. FIG. 3 is not to scale because of the difficulty in showing very small dimensions. Typically each shield S1, S2 is several microns thick in the along-the-track direction, as compared to the total thickness of the read head 100 in the along-the-track direction, which may be in the range of 20 to 40 nm.

Figure 4:
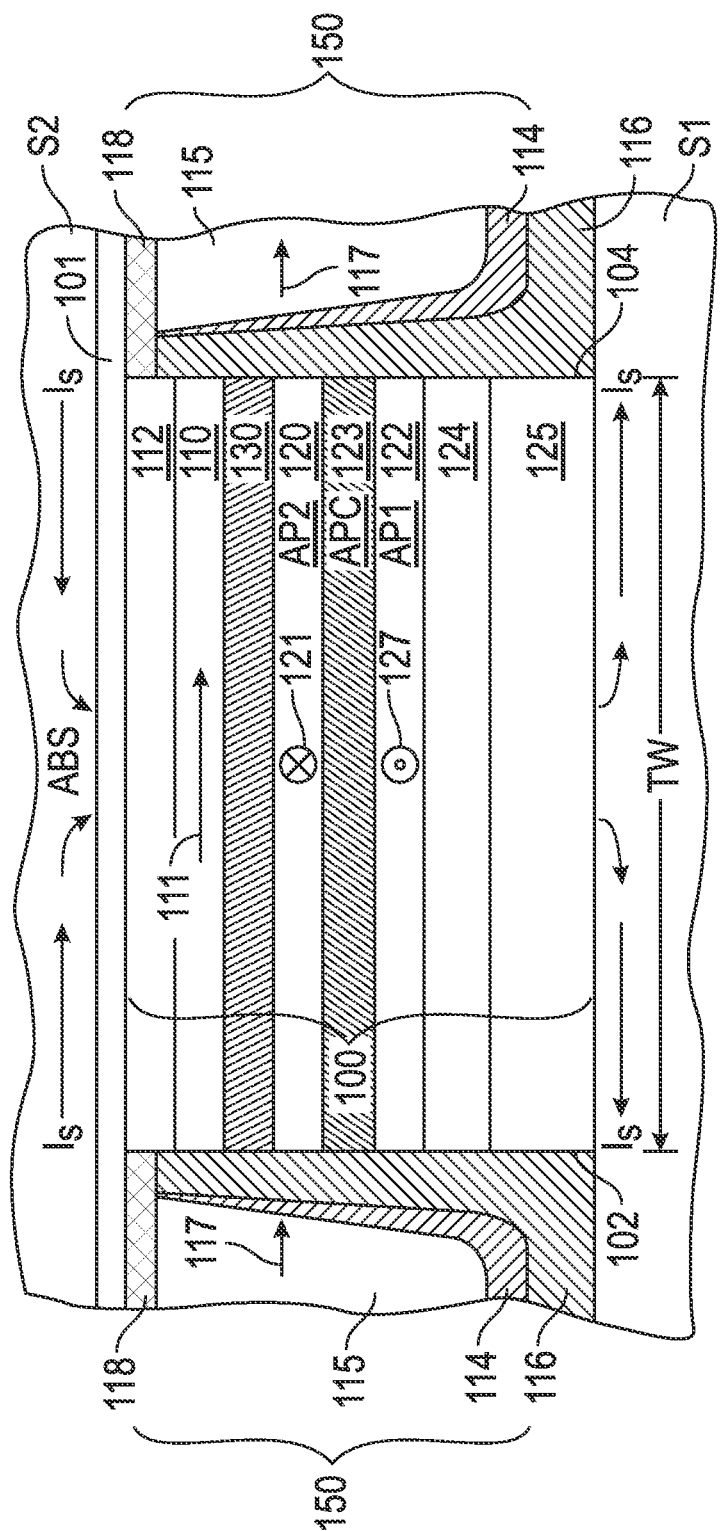
FIG. 4 is a cross-sectional schematic view of a prior art CPP-MR read head having an antiparallel-pinned (AP-pinned) structure and showing the stack of layers located between the magnetic shield layers.

FIG. 4 is a view of the ABS showing the layers making up a CPP MR sensor structure as would be viewed from the disk. Sensor 100 is a CPP MR read head comprising a stack of layers formed between the two magnetic shield layers S1, S2. The sensor 100 has a front edge at the ABS and spaced-apart side edges 102, 104 that define the track width (TW). The shields S1, S2 are formed of electrically conductive material and thus may also function as electrical leads for the sense current $I_S$, which is directed generally perpendicularly through the layers in the sensor stack. Alternatively, separate electrical lead layers may be formed between the shields S1, S2 and the sensor stack. The lower shield S1 is typically polished by chemical-mechanical polishing (CMP) to provide a smooth substrate for the growth of the sensor stack. A seed layer 101, such as a thin Ru/NiFe bilayer, is deposited, typically by sputtering, below S2 to facilitate the electroplating of the relatively thick S2.

The sensor 100 layers include a ferromagnetic reference layer 120 having a fixed magnetic moment or magnetization direction 121 oriented transversely (into the page), a ferromagnetic free layer 110 having a magnetic moment or magnetization direction 111 that can rotate in the plane of layer 110 in response to transverse external magnetic fields to be sensed from the disk 12, and a nonmagnetic spacer layer 130 between the reference layer 120 and free layer 110. The CPP MR sensor 100 may be a CPP GMR sensor, in which case the nonmagnetic spacer layer 130 would be formed of an electrically conducting material, typically a metal like Cu, Au or Ag. Alternatively, the CPP MR sensor 100 may be a CPP tunneling MR (CPP-TMR) sensor, in which case the nonmagnetic spacer layer 130 would be a tunnel barrier formed of an electrically insulating material, like $TiO_2$, MgO or $Al_2O_3$.

The ferromagnetic reference layer in a CPP MR sensor may be a single or "simple" pinned layer or part of an antiparallel (AP) pinned structure like that shown in FIG. 4. An AP-pinned structure has first (AP1) and second (AP2) ferromagnetic layers 122, 120, respectively, separated by a nonmagnetic antiparallel coupling (APC) layer 123 with the magnetization directions of the two AP-pinned ferromagnetic layers 127,121, respectively, oriented substantially antiparallel. The AP2 layer 120, which is in contact with the nonmagnetic APC layer 123 on one side and the sensor's nonmagnetic spacer layer 130 on the other side, is the reference layer. The AP1 layer 122, which is typically in contact with an antiferromagnetic (AF) layer 124 on one side and the nonmagnetic APC layer 123 on the other side, is typically referred to as the pinned layer. The AP-pinned structure minimizes the net magnetostatic coupling between the reference/pinned layers and the CPP MR free layer.

The AP1 and AP2 layers, as well as the free ferromagnetic layer 110, are typically formed of crystalline CoFe or NiFe alloys, amorphous or crystalline CoFeB alloys, or a multilayer of these materials, such as a CoFe/NiFe bilayer. Alternatively, the ferromagnetic layers may comprise a ferromagnetic Heusler alloy with high spin polarization such as $Co_2XY$, where X is Fe, Mn or their alloys and Y is Si, Al, Ge, Ga, Sn or their alloys. The APC layer 123 is typically Ru, Ir, Rh, Cr or alloys thereof. The AP1 and AP2 ferromagnetic layers have their respective magnetization directions 127, 121 oriented antiparallel. The AP1 layer 122 may have its magnetization direction pinned by being exchange-coupled to AF layer 124 as shown in FIG. 4. The AF layer 124 is typically a Mn alloy, e.g., PtMn, NiMn, FeMn, IrMn, PdMn, PtPdMn or RhMn. Alternatively, the AP1 layer 122 may be pinned by a hard magnetic layer such as $Co_{100-x}Pt_x$ or $Co_{100-x-y}Pt_xCr_y$ (where x is about between 8 and 30 atomic percent). Instead of being in contact with AF layer 124 or with a hard magnetic layer, AP1 layer 122 by itself can be comprised of hard magnetic material so that it is in contact with an underlayer on one side and the nonmagnetic APC layer 123 on the other side.

A seed layer 125 may be located between the lower shield layer 51 and the AP-pinned structure. If AF layer 124 is used, the seed layer 125 enhances the growth of the AF layer 124. The seed layer 125 is typically one or more layers of NiFeCr, NiFe, Ta, Cu or Ru. A capping layer 112 is located between the free ferromagnetic layer 110 and the upper shield layer S2. The capping layer 112 provides corrosion protection and may be a single layer or multiple layers of different materials, such as Ru, Ta, Ti, or a Ru/Ta/Ru, Ru/Ti/Ru, or Cu/Ru/Ta trilayer.

In the presence of an external magnetic field in the range of interest, i.e., magnetic fields from recorded data on the disk, the magnetization direction 111 of free layer 110 will rotate while the magnetization direction 121 of reference layer 120 will remain fixed and not rotate. Thus when a sense current $I_S$ is applied from top shield S2 perpendicularly through the sensor stack to bottom shield S1 (or from S1 to S2), the magnetic fields from the recorded data on the disk will cause rotation of the free-layer magnetization 111 relative to the reference-layer magnetization 121, which is detectable as a change in electrical resistance.

A hard magnet biasing structure 150 is formed outside of the sensor stack near the side edges 102, 104 of the sensor 100, particularly near the side edges of free layer 110. The structure 150 includes a ferromagnetic biasing layer 115 with high crystalline anisotropy ($K_u$) and thus high coercivity ($H_c$) and is thus also called the "hard bias" layer. The structure 150 also includes a seed layer below the biasing layer 115 and a capping layer 118 on the biasing layer 115. The structure 150 is electrically insulated from side edges 102, 104 of sensor 100 by a thin electrically insulating layer 116, which is typically alumina ($Al_2O_3$) but may also be a silicon nitride ($SiN_x$) or another metal oxide like a Ta oxide or a Ti oxide. The shield layer S1 serves as a substrate for the hard biasing structure 150, with the insulating layer 116 being located between the biasing structure 150 and S1. The seed layer 114 is deposited on the insulating layer 116. The biasing layer 115 has a magnetization 117 generally parallel to the ABS and thus longitudinally biases the magnetization 111 of the free layer 110. Thus in the absence of an external magnetic field the magnetization 117 of biasing layer 115 is parallel to the magnetization 111 of the free layer 110.

Figure 5:
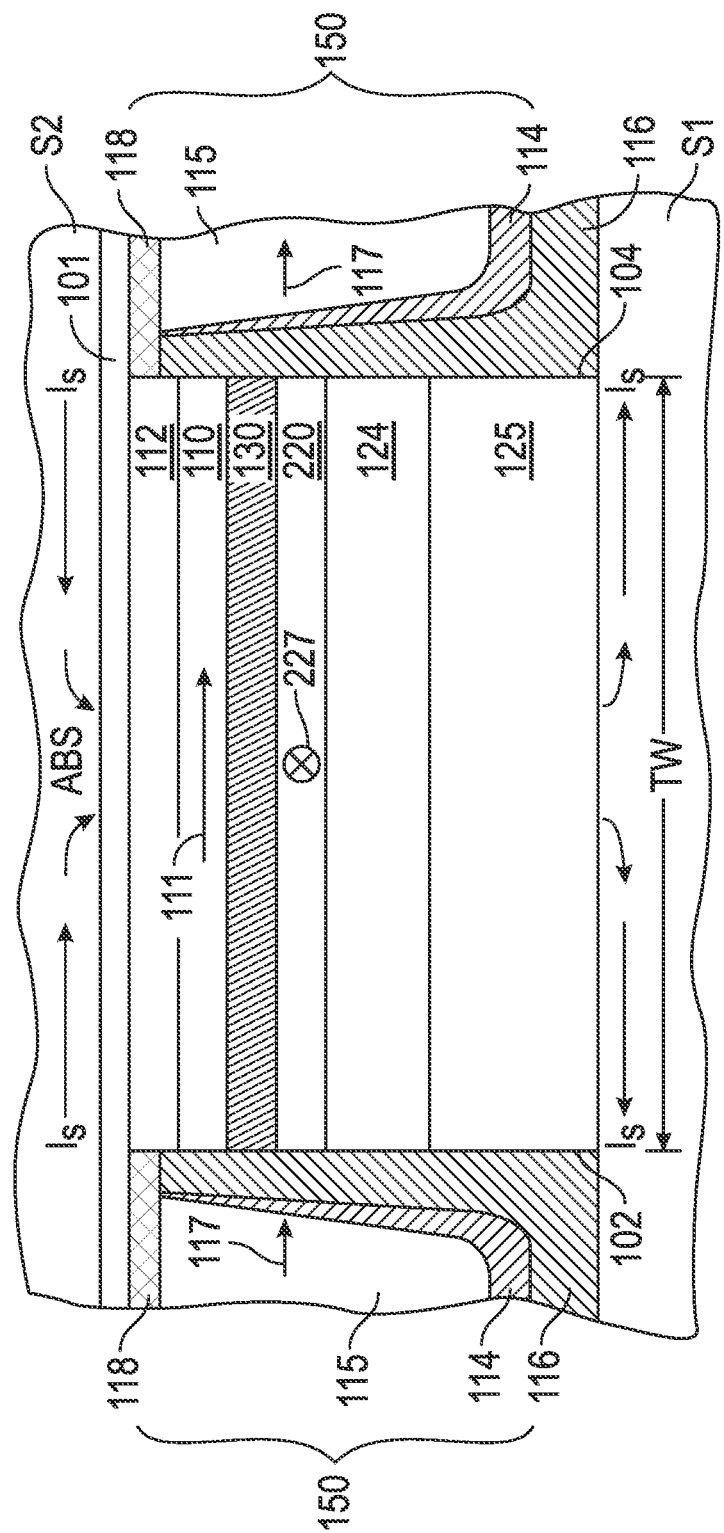
FIG. 5 is a cross-sectional schematic view of a prior art CPP-MR read head having a simple-pinned reference layer and showing the stack of layers located between the magnetic shield layers.

FIG. 5 is a view of the ABS showing the layers making up a CPP MR sensor structure like that in FIG. 4 but wherein the AP-pinned structure with reference layer 120 is replaced by a simple-pinned reference layer 220. The simple-pinned ferromagnetic reference layer 220 has its magnetization direction 227 pinned by being exchange coupled to AF layer 124.

Figure 6:
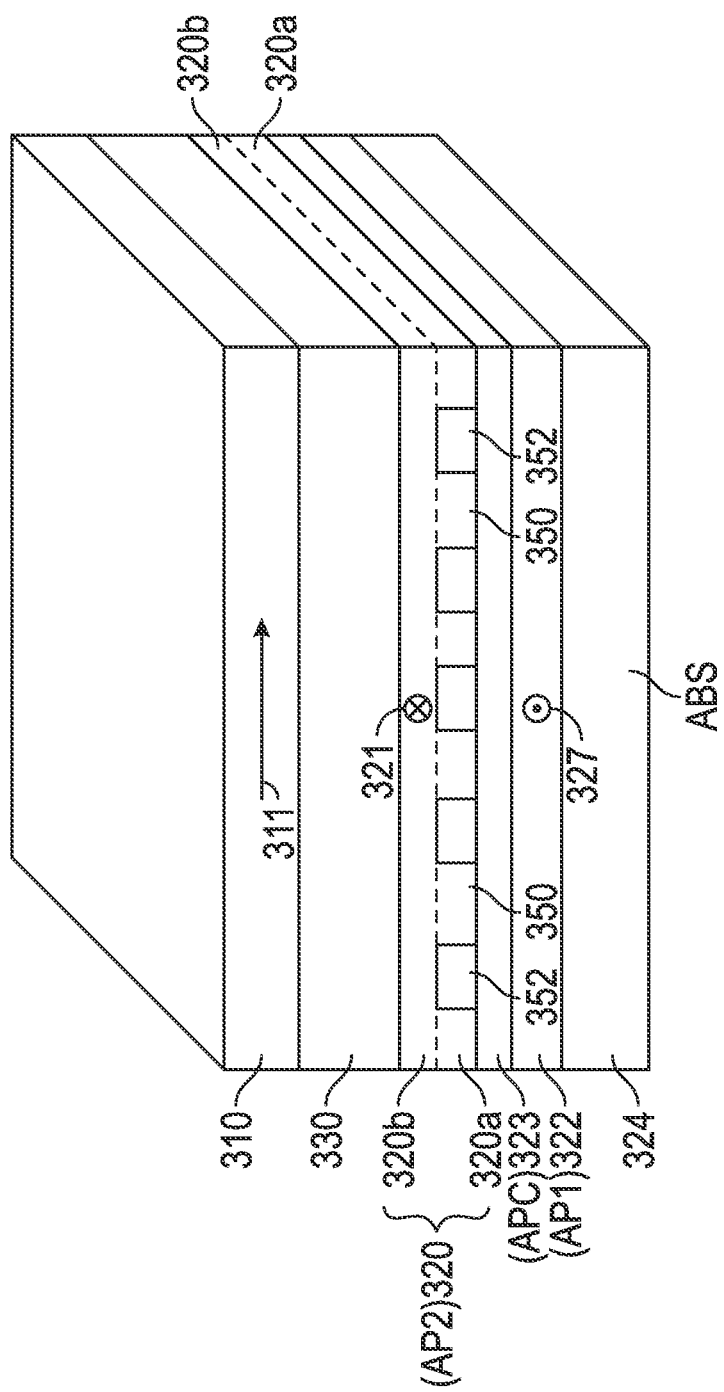
FIG. 6 is a perspective view of the exchange-coupled structure according to the invention as the AP2 layer in an AP-pinned structure.

This invention is a CPP-MR sensor like that described and shown in FIGS. 4 and 5, but wherein the reference layer 120 or 220 is an exchange-coupled structure. FIG. 6 shows the exchange-coupled structure 320 according to the invention as the AP2 layer in an AP-pinned structure with AP1 layer 322 and APC layer 323. AP1 layer 322 is shown with its magnetization direction 327 being pinned generally orthogonal to the ABS by AF layer 324. The CPP-MR sensor includes ferromagnetic free layer 310 with magnetization direction 311 and nonmagnetic spacer layer 330. The exchange-coupled structure 320 comprises a patterned layer 320a, formed of alternating stripes of ferromagnetic stripes 350 and nonmagnetic stripes 352, and a continuous unpatterned ferromagnetic layer 320b in contact with and exchange-coupled to the ferromagnetic stripes 350 of the patterned layer 320a.

Figure 7:
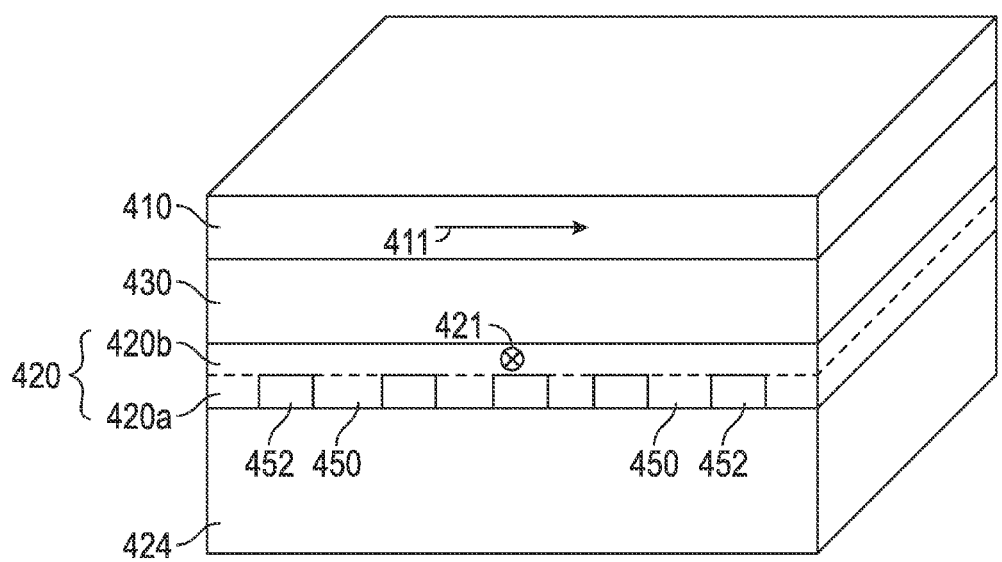
FIG. 7 is a perspective view of the exchange-coupled structure according to the invention as a simple-pinned reference layer.

FIG. 7 shows the exchange-coupled structure 420 according to the invention as a simple-pinned reference layer with its magnetization direction 421 being pinned generally orthogonal to the ABS by AF layer 424. The CPP-MR sensor includes ferromagnetic free layer 410 with magnetization direction 411 and nonmagnetic spacer layer 430. The exchange-coupled structure 420 comprises a patterned layer 420a, formed of alternating stripes of ferromagnetic stripes 450 and nonmagnetic stripes 452, and a continuous unpatterned ferromagnetic layer 420b in contact with and exchange-coupled to the ferromagnetic stripes 450 of the patterned layer 420a. While FIGS. 6 and 7, as well as the prior art in FIGS. 4 and 5, depict the reference layer and free layer as having the same surface areas, it is well-known that the reference layer can have a larger surface area than the free layer by having a width greater than the TW and/or by having a depth greater than the SH. MR sensors with this type of structure are described, for example, in U.S. Pat. No. 7,346,977 B2 and US 20030231437 A1. Thus in this invention the reference layers 320, 420 may have a larger surface area than their respective free layers 310, 410.

Figure 8A:
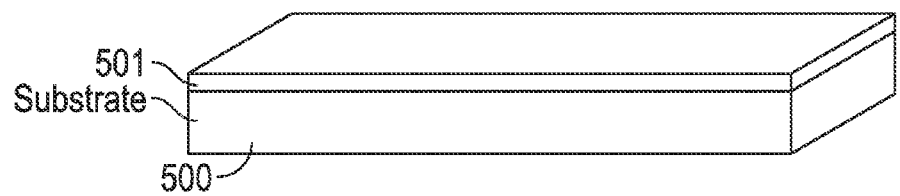
FIGS. 8A-8F illustrate the steps in making the exchange-coupled structure of the invention.
Figure 8B:
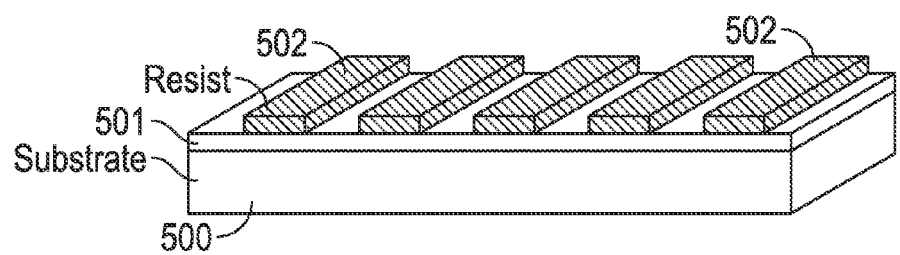
Figure 8C:
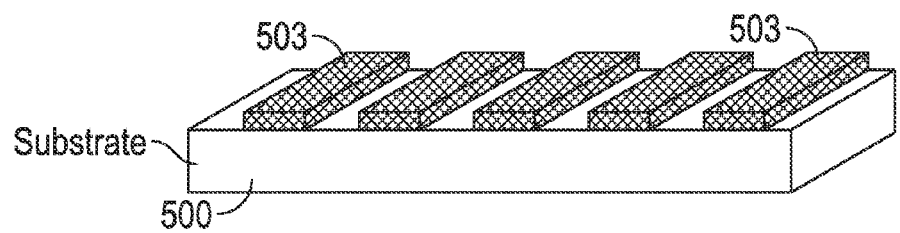
Figure 8D:
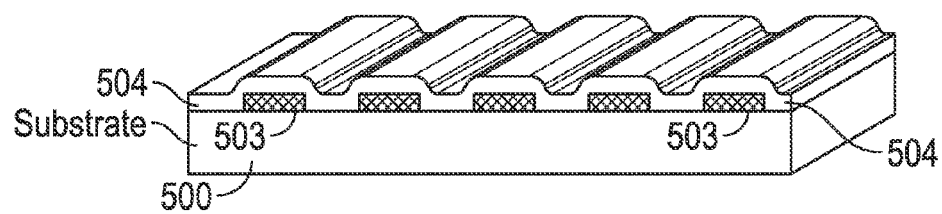
Figure 8E:
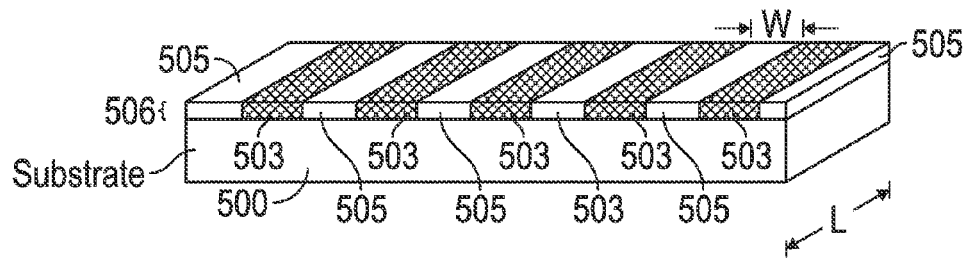
Figure 8F:
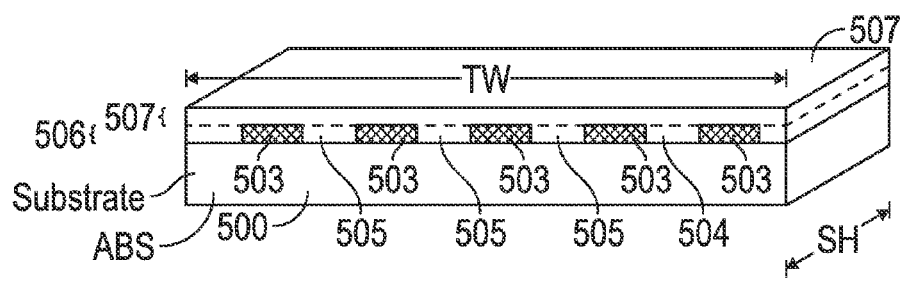

FIGS. 8A-8F illustrate the steps in making the exchange-coupled structure of this invention. In FIG. 8A, a continuous nonmagnetic layer 501 is deposited, such as by sputtering, onto a substrate 500. The substrate 500 may be, for example, APC layer 323 (FIG. 6) or AF layer 424 (FIG. 7), or a suitable seed layer. The nonmagnetic layer 501 may be an oxide like an oxide of silicon, tantalum, or aluminum, a nitride of silicon, or nonmagnetic metals such as Cu, Cr, Ru, or Ta, and is deposited to a thickness between about 1 to 4 nm. Next, in FIG. 8B, a layer of resist is lithographically patterned into parallel stripes 502 on nonmagnetic layer 501. The resist stripes 502 are then used as a hard mask for etching, such as by wet etching, reactive ion etching (RIE), or ion milling, to transfer the resist pattern into the nonmagnetic layer 501. After removal of the resist stripes 502, a pattern of parallel nonmagnetic stripes 503 is formed on the substrate 500, as shown in FIG. 8C. Next, in FIG. 8D, ferromagnetic material 504 is deposited, such as by sputtering, over the structure of FIG. 8C to a thickness at least as thick as the nonmagnetic stripes 503. The ferromagnetic material may be any of the materials described above for use as the ferromagnetic reference layer. Then the structure of FIG. 8D is subjected to chemical-mechanical polishing (CMP) to remove the ferromagnetic material above the nonmagnetic stripes 503, resulting in the patterned layer 506 shown in FIG. 8E. The patterned layer 506 on substrate 500 is a pattern of alternating nonmagnetic stripes 503 and ferromagnetic stripes 505. Next a continuous unpatterned layer 507 of ferromagnetic material is deposited, such as by sputtering, on the structure of FIG. 8E. The material of ferromagnetic layer 507 is preferably the same as the material of layer 504 and is deposited to a thickness between about 1 to 4 nm. This results in the completed exchange-coupled structure shown in FIG. 8F with unpatterned ferromagnetic layer 507 on patterned layer 506 and exchange-coupled to the ferromagnetic stripes 505. In FIG. 8F, the exchange-coupled structure of layers 506, 507 may be, for example, the reference layer 220 and substrate 500 may be AF layer 124 as in FIG. 4, with the sensor having a trackwidth TW and a stripe height (SH).

The ferromagnetic stripes 505 have a width W and length L, as shown in FIG. 8E, with a relatively large aspect ratio (L/W). The length L is the sensor SH. This results in increased uniaxial anisotropy of the exchange-coupled ferromagnetic layer 507 in a direction orthogonal to the ABS due to shape anisotropy. The aspect ratio (L/W) of the ferromagnetic stripes 505 is preferably at least 2, which is typically much larger than the MR sensor aspect ratio (SH/TW). For example, the sensor may have a TW of about 30 nm and a SH of about 35 nm. The exchange-coupled structure may have at least 2 ferromagnetic stripes each with a width W of about 10 nm, which would result in an aspect ratio of 3.5 for a SH of 35 nm. As shown in FIG. 8F, the ferromagnetic stripes 505 are oriented orthogonal to the ABS so that the fixed magnetization direction of the exchange-coupled reference layer will also be orthogonal to the ABS.

Figure 9:
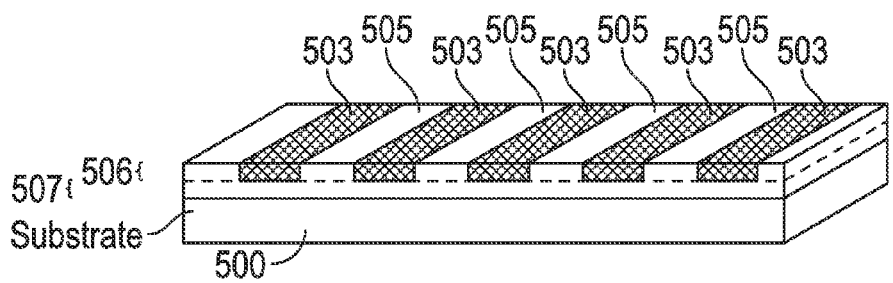
FIG. 9 illustrates an embodiment of the exchange-coupled structure according to the invention wherein the patterned layer is located above the unpatterned ferromagnetic layer.
Figure 10:
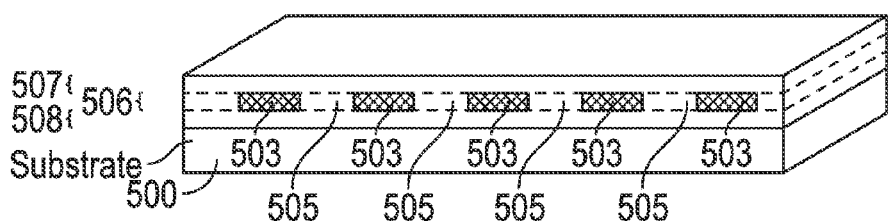
FIG. 10 illustrates an embodiment of the exchange-coupled structure according to the invention wherein there are two unpatterned ferromagnetic layers one, each unpatterned ferromagnetic layer being in contact with and exchange coupled to the ferromagnetic stripes of the patterned layer.

FIG. 9 illustrates an embodiment of the exchange-coupled structure according to the invention wherein the patterned layer 506 is located above the unpatterned ferromagnetic layer 507. FIG. 10 illustrates an embodiment of the exchange-coupled structure according to the invention wherein the unpatterned ferromagnetic layer 507 of the exchange-coupled structure is a first unpatterned ferromagnetic layer, and a second unpatterned ferromagnetic layer 508 is in contact with and exchange-coupled to the ferromagnetic stripes 505 of the patterned layer 506. The patterned layer 506 is located between and in contact with the first and second unpatterned ferromagnetic layers 507 and 508, respectively.

While FIGS. 6 and 7, as well as the prior art in FIGS. 4 and 5, depict the reference layer and free layer as having the same surface areas, it is well-known that the reference layer can have a larger surface area than the free layer by having a width greater than the TW and/or by having a depth greater than the SH. MR sensors with this type of structure are described, for example, in U.S. Pat. No. 7,346,977 B2 and US 20030231437 A1. Thus in this invention the reference layers 320, 420 may have a larger surface area than their respective free layers 310, 410.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed:

1. A magnetoresistive sensor comprising:
   a substrate;
   a ferromagnetic reference layer on the substrate and having an in-plane magnetization direction fixed in the presence of an external magnetic field to be sensed, the reference layer being an exchange-coupled structure comprising a patterned layer of alternating ferromagnetic stripes and nonmagnetic stripes and an unpatterned ferromagnetic layer in contact with and exchange-coupled to the ferromagnetic stripes of the patterned layer;
   a ferromagnetic free layer having an in-plane magnetization direction substantially free to rotate in the presence of an external magnetic field to be sensed; and
   a nonmagnetic spacer layer between the reference layer and the free layer.

2. The sensor of claim 1 wherein the patterned layer of the exchange-coupled structure is between the substrate and the unpatterned ferromagnetic layer of the exchange-coupled structure.

3. The sensor of claim 1 wherein the unpatterned ferromagnetic layer of the exchange-coupled structure is a first unpatterned ferromagnetic layer, wherein the exchange-coupled structure further comprises a second unpatterned ferromagnetic layer in contact with and exchange-coupled to the ferromagnetic stripes of the patterned layer, and wherein the patterned layer is located between and in contact with the first and second unpatterned ferromagnetic layers.

4. The sensor of claim 1 further comprising an antiferromagnetic layer between the substrate and the reference layer, wherein the magnetization direction of the reference layer is fixed by being exchange-coupled to the antiferromagnetic layer.

5. The sensor of claim 1 wherein the sensor includes an antiparallel (AP) pinned structure comprising a first AP-pinned (AP1) ferromagnetic layer having an in-plane magnetization direction, a second AP-pinned (AP2) ferromagnetic layer having an in-plane magnetization direction substantially antiparallel to the magnetization direction of the AP1 layer, and an AP coupling (APC) layer between and in contact with the AP1 and AP2 layers, wherein the AP2 layer comprises said reference layer.

6. The sensor of claim 1 wherein the sensor is a magnetoresistive read head for reading magnetically recorded data from tracks on a magnetic recording medium, and wherein the substrate is a first shield formed of magnetically permeable material.

7. The sensor of claim 1 wherein the nonmagnetic spacer layer is an electrically conducting layer.

8. The sensor of claim 1 wherein the nonmagnetic spacer layer is an electrically insulating layer.

9. A current-perpendicular-to-the-plane (CPP) magnetoresistive (MR) read head structure for reading magnetically recorded data from tracks on a magnetic recording disk in a disk drive, the read head structure comprising:
   an air-bearing slider having an air-bearing surface (ABS) for facing the disk and a trailing surface generally orthogonal to the ABS;
   a first shield layer of magnetically permeable material on the slider's trailing surface;
   a MR read head on the first shield layer comprising a stack of layers having a front edge substantially at the ABS, a back edge recessed from the front edge by a distance that defines a sensor stripe height (SH), and two spaced-apart side edges that define a read head track width (TW), the stack of layers comprising
      a ferromagnetic reference layer having an in-plane magnetization fixed in a direction substantially orthogonal to the ABS, the reference layer being an exchange-coupled structure comprising a patterned layer of alternating ferromagnetic stripes and nonmagnetic stripes and an unpatterned ferromagnetic layer in contact with and exchange-coupled to the ferromagnetic stripes of the patterned layer, wherein the ferromagnetic stripes have a width W parallel to TW and an aspect ratio SH/W greater than or equal to 2;
      a ferromagnetic free layer having an in-plane magnetization direction substantially free to rotate; and
      a nonmagnetic spacer layer between the reference layer and the free layer; and
   a second shield layer on the MR read head stack of layers.

10. The read head structure of claim 9 wherein the patterned layer of the exchange-coupled structure is between the first shield layer and the unpatterned ferromagnetic layer of the exchange-coupled structure.

11. The read head structure of claim 9 wherein the unpatterned ferromagnetic layer of the exchange-coupled structure is a first unpatterned ferromagnetic layer, wherein the exchange-coupled structure further comprises a second unpatterned ferromagnetic layer in contact with and exchange-coupled to the ferromagnetic stripes of the patterned layer, and wherein the patterned layer is located between and in contact with the first and second unpatterned ferromagnetic layers.

12. The read head structure of claim 9 further comprising an antiferromagnetic layer between the first shield layer and the reference layer, wherein the magnetization direction of the reference layer is fixed by being exchange-coupled to the antiferromagnetic layer.

13. The read head structure of claim 9 wherein the read head structure includes an antiparallel (AP) pinned structure comprising a first AP-pinned (AP1) ferromagnetic layer having an in-plane magnetization direction, a second AP-pinned (AP2) ferromagnetic layer having an in-plane magnetization direction substantially antiparallel to the magnetization direction of the AP1 layer, and an AP coupling (APC) layer between and in contact with the AP1 and AP2 layers, wherein the AP2 layer comprises said reference layer.

14. The read head structure of claim 9 wherein the non-magnetic spacer layer is an electrically conducting layer.

15. The read head structure of claim 9 wherein the non-magnetic spacer layer is an electrically insulating layer.

* * * * *